United States Patent [19]

Kim et al.

[11] Patent Number: 5,132,568

[45] Date of Patent: Jul. 21, 1992

[54] TRI-STATE OUTPUT CIRCUIT UTILIZING A BICMOS INVERTER CIRCUIT

[75] Inventors: Young M. Kim, Seo Gu; Won C. Song; Jin I. Hyun, both of Yu-Sung Gu; Hah Y. Yoo, Jung-Gu, all of Rep. of Korea

[73] Assignees: Electronics and Telecommunications Research Institute, Daejeon; Korea Telecommunication Authority, Seoul, both of Rep. of Korea

[21] Appl. No.: 689,374

[22] Filed: Apr. 22, 1991

[30] Foreign Application Priority Data

Apr. 26, 1990 [KR] Rep. of Korea .................. 1990-5888

[51] Int. Cl.⁵ .................. H03K 19/02; H03K 19/094
[52] U.S. Cl. .................. 307/446; 307/451; 307/473; 307/475; 307/570
[58] Field of Search .............. 307/446, 451, 473, 475, 307/570

[56] References Cited

U.S. PATENT DOCUMENTS

| | | | |
|---|---|---|---|
| 4,769,561 | 9/1988 | Iwamura et al. | 307/446 |
| 4,779,014 | 10/1988 | Masuoka et al. | 307/446 |
| 4,806,797 | 2/1989 | Yamazaki | 307/446 |
| 4,985,645 | 1/1991 | Tsutui | 307/446 |

FOREIGN PATENT DOCUMENTS 0270916 12/1986 Japan .................. 307/473

Primary Examiner—Stanley D. Miller
Assistant Examiner—Margaret Wambach
Attorney, Agent, or Firm—Blakely, Sokoloff, Taylor & Zafman

[57] ABSTRACT

A tri-state logic circuit of a BiCMOS having a power saving characteristic, a strong noise durability, a desirable driving characteristic and switching charaacteristic is disclosed. The circuit comprises PMOS transistors M1,M5 and NMOS transistors M2,M3,M4,M6,M7,M8,M9 and bipolar transistors Q1,Q2 and a capacitor C1.

2 Claims, 2 Drawing Sheets

TRI-STATE OUTPUT CIRCUIT UTILIZING A BICMOS INVERTER CIRCUIT

BACKGROUND OF THE INVENTION

1. Field of the Invention

This invention relates to a tri-state logic circuit, and more particularly, to a tri-state logic circuit of a BiCMOS (Bipolar Complementary Metal Oxide Semiconductor) having a power saving characteristic, a strong noise durability, a desirable driving characteristic and switching characteristic.

2. Information Disclosure statement

Generally, in the prior art BiCMOS inverter circuit as shown in FIG. 1, when the emitter electrode of an NPN bipolar transistor Q9, that is, an output node(OUT), is in a high logic state, if an input with high logic state is inputted from an input node(IN), a PMOS transistor M41 becomes non-conducting (OFF), and NMOS transistors M42,M43 become conducting (ON), thereby an NPN bipolar transistor Q9 as well as an NMOS transistor M44 having a gate electrode connected to the drain electrode of a PMOS transistor M41, and the NMOS transistor M44 having a drain electrode connected to the base electrode of an NPN bipolar transistor Q10 respectively, resulting in the NMOS transistor M44 and NPN bipolar transistor Q9 becoming non-conducting.

Thus, the voltage of a voltage source VDD is isolated from the output node(OUT) and the base electrode of a bipolar transistor Q10 is effectively connected to the output node(OUT) through the drain-source of NMOS transistor M43 which is turned on by input, thereby the electric charges in a capacitor C4 are discharged through the collector-emitter path of an NPN bipolar transistor Q10.

Where, the NMOS transistor M44 becomes non-conducting so that a large amount of current can be conducted through the collector-emitter path of the NPN bipolar transistor Q10, this discharge changes the output node(OUT) to low logic and the NPN bipolar transistor Q10 becomes also non-conducting upon discharging the electric charge charged in the capacitor C4 to some degree.

On the other hand, the output node(OUT) becomes high logic if an input with low logic is inputted from the input node(IN), where the PMOS transistor M41 becomes conducting, and the NMOS transistors M42, M43 become non-conducting.

Thus, the voltage of the voltage source VDD propagates through the drain-source electrode path of the PMOS transistor M41 so that the NPN bipolar transistor Q9 and NMOS transistor M44 become conducting, where, the NMOS transistor M43 becomes non-conducting and the NMOS transistor M44 becomes conducting so that the base electrode of the NPN bipolar transistor Q10 becomes low logic, thereby it becomes non-conducting.

Accordingly, the voltage of the voltage source VDD is applied, through the collector-emitter electrode path of the NPN bipolar transistor Q9, to the output node(OUT) and to the capacitor C4, thereby the output node(OUT) becomes high logic.

Thus, the potential difference between the collector electrode and the emitter electrode of the NPN bipolar transistor Q9 becomes approximately 0 by charging the capacitor C4 so that the very low current-flowing state is maintained at the output node(OUT) again.

Accordingly, a large amount of current is conducted through the NPN bipolar transistor with a small power consumption so that a desired driving characteristic is obtained.

FIG. 2 illustrates a prior art tri-state logic circuit utilizing a BiCMOS logic circuit which uses a bipolar transistor as a buffer.

Referring to FIG. 2, data from an input node(Data in) is applied, through an inverter I1, to one terminal of NOR gate N1, and to one terminal of NOR gate N2, directly.

A tri-state control signal is applied to the other terminals of the NOR gates N1,N2, each output terminal of which is connected to each base electrode of the NPN bipolar transistors Q11,Q12.

A voltage of a voltage source VDD is applied to the collector electrode of the transistor Q11 having an emitter electrode connected to an output node(Data out), and to a capacitor C5, and, to the collector electrode of the NPN bipolar transistor Q12 having a emitter electrode connected to ground.

In the above mentioned prior art tri-state logic circuit, although the driving characteristic of the NPN bipolar transistor is fully utilized, there are disadvantages in that the entire circuit constitution is complicated and a lot of power is consumed, because one of the two NPN bipolar transistors Q11,Q12 is continuously conducting.

SUMMARY OF THE INVENTION

It is an object of the present invention to provide a tri-state output circuit of BiCMOS having a power saving and high driving characteristic.

To achieve said object in this invention, a tri-state logic circuit of a BiCMOS having a power saving characteristic, a strong noise durability, a desirable driving characteristic and switching characteristic is disclosed.

The circuit comprises PMOS transistors and NMOS transistors and bipolar transistors and a capacitor.

BRIEF DESCRIPTION OF THE DRAWINGS

For fuller understanding of the nature and objects of the invention, reference should be made to the following detailed description in conjunction with the accompanying drawings in which.

DETAILED DESCRIPTION OF THE INVENTION

Figure 1:
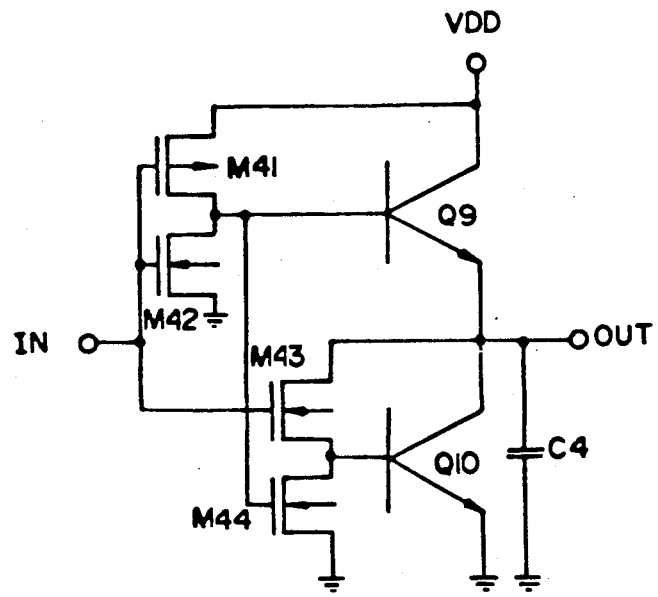
FIG. 1 illustrates a BiCMOS inverter circuit diagram according to the prior art.
Figure 2:
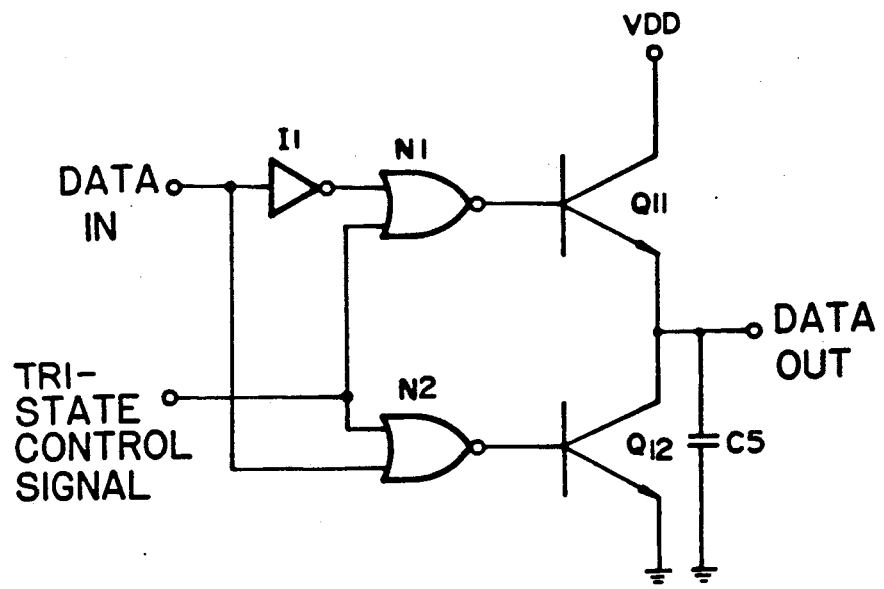
FIG. 2 illustrates a tri-state output circuit diagram of a BiCMOS utilizing the prior art logic circuit.

Since circuits shown in FIG. 1 and FIG. 2 are explained in the former paragraphs, the further description of such drawings will be abbreviated for simplicity.

The present invention will be described in conjunction with FIG. 3.

Figure 3:
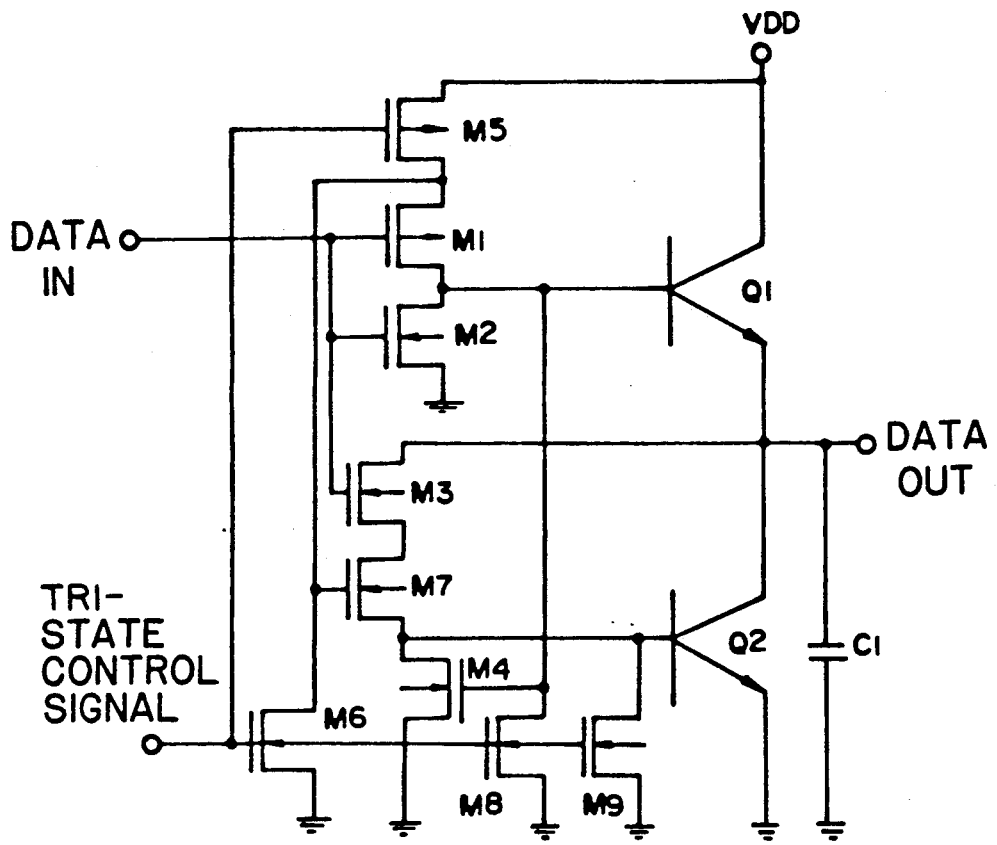
FIG. 3 illustrates a tri-state output circuit diagram of a BiCMOS according to the present invention.

FIG. 3 illustrates a tri-state output circuit in which an output node achieves a high resistance state upon input of a tri-state control signal.

The tri-state output circuit utilizing a BiCMOS inverter circuit comprises, an input node(Data in) connected to the gate electrodes of a PMOS transistor M1 and NMOS transistors M2,M3, a PMOS transistor M5 and NMOS transistors M6,M8,M9, with a tri-state control signal applied to the gate electrodes there-of, the PMOS transistor M5 having a source electrode connected to a driving voltage source VDD, and a drain electrode connected to the drain electrode of the NMOS transistor M6 and to the source electrode of PMOS transistor M1, the NMOS transistor M2 having a source electrode connected to the ground, and a drain electrode connected to the drain electrode of the PMOS transistor M1;

the PMOS transistor M1 having the drain electrode connected to the base electrode of the NPN bipolar transistor Q1, and to the gate electrode of the NMOS transistor M4, the source electrode of which is connected to the ground, and to the drain electrode of the NMOS transistor M8, the source electrode of which is connected to the ground, the NPN transistor Q1 having collector electrode connected to the driving voltage source VDD, and the emitter electrode connected to an output node(Data out), and to a capacitor C1 and the collector electrode of an NPN bipolar transistor Q2, and to the drain electrode of the NMOS transistor M3, the NMOS transistor M7 having a drain electrode connected to the source electrode of the NMOS transistor M3, and a source electrode connected to the drain electrode of the NMOS transistor M4, the source electrode of which is connected to the ground, and to the drain electrode of the NMOS transistor M9, the source electrode of which is connected to ground, and to the base electrode of the NPN bipolar transistor Q2, the emitter of which is connected to the ground.

Accordingly, in case of the tri-state control signal not being asserted, that is, in case of the tri-state circuit not being used, the PMOS transistor M5 becomes conducting and, the NMOS transistors M6, M8, M9 become non-conducting.

The voltage source VDD is supplied as a high logic, through the drain-source electrode path of the PMOS transistor M5, to the source electrode of the PMOS transistor M1, and to the gate electrode of the NMOS transistor M7, thereby it becomes conducting.

Accordingly, the input data from the input node(Data in) controls the output node(Data out) so that the circuit is operated as a BiCMOS inverter circuit.

Where, if the width of the PMOS transistor M5 and NMOS transistor M7 are made large, the effect of adding these transistors to the characteristic of another logic is ignored.

On the other hand, in case of the tri-state control signal being inputted as a high logic, the NMOS transistors M6, M8, M9 become conducting and the transistors M5, M7 become non-conducting so that the voltage of the voltage source is not supplied to the base electrodes of the two NPN bipolar transistor Q1,Q2 and the electric charge in the base electrode is discharged through the two NMOS transistors M8, M9, thereby Q1 and Q2 become non-conducting and the output node(Data out) achieves a high resistance state.

Where, if the circuit of the present invention is not in the tri-state, the PMOS transistor M5 should be in the conducting state and the voltage source VDD should be connected to the source electrode of the PMOS transistor M1.

However, in case of an NMOS transistor being used instead of PMOS M5, the voltage drop of the threshold voltage Vt will appear through the NMOS transistor. Thus, the lowered voltage(VDD-Vt) is supplied to the source electrode of the PMOS transistor M1 so that the NMOS transistor is not used.

Also, when the NMOS transistor M7 is used as a general inverter, it becomes conducting and the low potential at the base electrode of the bipolar transistor Q2 is transferred, as it is, to the NMOS transistor M3.

The PMOS transistor has resistance larger than that of the NMOS transistor for that case so that the NMOS transistor M7 is used.

Figure 4:
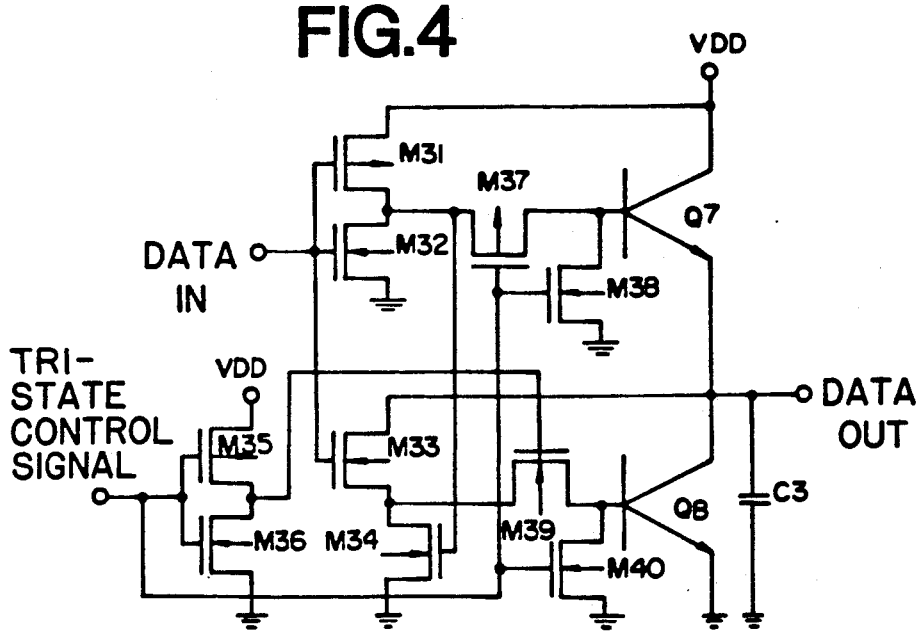
FIG. 4 illustrates a circuit diagram of another example according to the present invention.

FIG. 4 illustrates another example of the tri-state output circuit according to the present invention.

A tri-state output circuit utilizing a BiCMOS inverter circuit comprises, an input node(Data in) connected to the gate electrodes of a PMOS transistor M31 and NMOS transistors M32, M33, a PMOS transistor M31 having a source electrode connected to a driving voltage source VDD, and a source electrode connected to the source electrode of the NMOS transistor M32, and to the gate electrode of an NMOS transistor M34, and to the source electrode of a PMOS transistor M37, an NPN bipolar transistor Q7 having a collector electrode connected to the driving voltage source VDD, and an emitter electrode connected to the drain electrode of NMOS transistor M33, and to the collector electrode of an NPN bipolar transistor Q8, and to a capacitor C3 and an output node(Data out), PMOS transistors M35, M37 and NMOS transistors M36, M38 and M40, having a tri-state control signal applied to each gate electrode there-of, the NMOS transistor M38 having a source electrode connected to the ground, and a drain electrode connected to the drain electrode of the second PMOS transistor M37, and to the base electrode of the NPN bipolar transistor Q7, the PMOS transistor M35 having a source electrode connected to the driving voltage source(VDD), and a drain electrode connected to the drain electrode of the NMOS transistor M36, and to the gate electrode of an NMOS transistor M39, the NMOS transistor M34 having a drain electrode connected to the source electrode of the NMOS transistor M33, and to the drain electrode of the NMOS transistor M39, the NMOS transistor M39 having a source electrode connected to the base electrode of an NPN bipolar transistor Q8, and to the drain electrode of the NMOS transistor M40, the source electrode of which is connected to the ground.

Accordingly, in case of the tri-state control signal not being asserted, that is, the tri-state control signal is applied as a low logic, the PMOS transistors M35, M37 become conducting and the NMOS transistors M36, M38 and M40 become non-conducting.

Thus, the input node(Data in) controls the output node(Data out) so that it is operated as a BiCMOS inverter circuit.

On the other hand, in case of the tri-state control signal being applied as high logic for the tri-state output circuit operation, the PMOS transistors M35,M37 become non-conducting and the NMOS transistors M36, M38 and M40 become conducting.

Thus, the voltage of the driving voltage source(VDD) is not applied, through the PMOS transistor M37, to the base electrode of the NPN bipolar transistor Q7 so that the electric charge in the base electrode is discharged through the NMOS transistor M38, thereby it becomes non-conducting.

The PMOS transistor M35 becomes non-conducting so that the NMOS transistor M39 becomes non-conducting.

Thus, charge in the base electrode is discharged through the NMOS transistor M40 so that Q8 becomes non-conducting, thereby a high resistance state is maintained at the output node(Data out).

As mentioned above, in the tri-state output circuit according to the present invention, in case of the tri-state output circuit not being used, the tri-state control signal is applied as low logic and the circuit is configured as a BiCMOS inverter circuit.

On the other hand, in case of the tri-state output circuit being used, the tri-state control signal is applied as high logic and the circuit is configured as the tri-state output circuit, and the desired driving characteristic is obtained with a small power consumption by using the non-conducting state of the two NPN bipolar transistor and the high resistance state of the output node (Data out).

What is claimed is:

1. A tri-state output circuit utilizing a BiCMOS inverter circuit comprising:
   an input node (Data in) connected to the gate electrode of a first PMOS transistor and a first and a second NMOS transistors;
   a second PMOS transistor and a third and a fourth NMOS transistors with a tri-state control signal applied to each gate electrode thereof;
   the second PMOS transistor having a source electrode connected to a driving voltage source, and a drain electrode connected to a drain electrode of the third NMOS transistor and to a source electrode of the first PMOS transistor;
   the first NMOS transistor having a source electrode connected to a ground, and a drain electrode connected to the drain electrode of the first PMOS transistor;
   the first PMOS transistor having a drain electrode connected to a base electrode of a first NPN bipolar transistor and to the drain electrode of the fourth NMOS transistor, the source electrode of which is connected to a ground;
   the first NPN transistor having a collector electrode connected to the driving voltage source, and an emitter electrode connected to an output node (Data out), and to a capacitor and the collector electrode of a second NPN bipolar transistor, and to the drain electrode of the second NMOS transistor;
   a fifth NMOS transistor having a drain electrode connected to the source electrode of the second NMOS transistor, and a source electrode connected to the base electrode of the second NPN bipolar transistor, the emitter of which is connected to a ground; and
   a sixth and a seventh NMOS transistors connected to the base electrode of the second NPN bipolar transistor.

2. A tri-state output circuit utilizing a BiCMOS inverter circuit comprising:
   an input node (Data in) connected to each gate electrode of a first PMOS transistor and a first and a second NMOS transistors;
   the first PMOS transistor having a source electrode connected to a driving voltage source, and a drain electrode connected to the drain electrode of the first NMOS transistor, and to a gate electrode of a third NMOS transistor, and to the source electrode of a second PMOS transistor,
   a first NPN bipolar transistor having a collector electrode connected to said driving voltage source, and an emitter electrode connected to the drain electrode of the second NMOS transistor, and to a collector electrode of a second NPN bipolar transistor, and to a first capacitor and to an output node (Data out),
   a third and the second PMOS transistors, a fourth, a fifth and a sixth NMOS transistors, with a tri-state control signal applied to each gate electrode thereof,
   the fifth NMOS transistor having a source electrode connected to a ground, and a drain electrode connected to the drain electrode of the second PMOS transistor, and to the base electrode of the first NPN bipolar transistor,
   the third PMOS transistor having a source electrode connected to said driving voltage source, and a drain electrode connected to the drain electrode of the fourth NMOS transistor, and to the gate electrode of a seventh NMOS transistor,
   the third NMOS transistor having a drain electrode connected to the source electrode of the second NMOS transistor, and to the drain electrode of the seventh NMOS transistor,
   the seventh NMOS transistor having a source electrode connected to a base electrode of the second NPN bipolar transistor, and to a drain electrode of the sixth NMOS transistor, the source electrode of which is connected to a ground.

* * * * *